(12) United States Patent
Yamazaki et al.

(10) Patent No.: US 7,492,025 B2
(45) Date of Patent: Feb. 17, 2009

(54) PHOTO COUPLER

(75) Inventors: Tomohiro Yamazaki, Kyoto (JP); Jun Ichihara, Kyoto (JP)

(73) Assignee: ROHM Co., Ltd., Kyoto-Fu (JP)

( * ) Notice: Subject to any disclaimer, the term of this patent is extended or adjusted under 35 U.S.C. 154(b) by 0 days.

(21) Appl. No.: 11/723,958

(22) Filed: Mar. 22, 2007

(65) Prior Publication Data

US 2007/0241343 A1    Oct. 18, 2007

(30) Foreign Application Priority Data

Mar. 23, 2006    (JP)    .......................... P2006-080123

(51) Int. Cl.
    *H01L 29/78*    (2006.01)
(52) U.S. Cl. ....................................... 257/433; 257/184
(58) Field of Classification Search .............. 257/433, 257/184
    See application file for complete search history.

(56) References Cited

U.S. PATENT DOCUMENTS 6,832,861 B2 * 12/2004 Kragl .......................... 385/88

FOREIGN PATENT DOCUMENTS

JP    2001-358361    12/2001

* cited by examiner

*Primary Examiner*—Douglas M Menz
(74) *Attorney, Agent, or Firm*—McDermott Will & Emery LLP

(57) ABSTRACT

A photo coupler includes a semiconductor laser, a semiconductor light-receiver, a resin protector, a reflective film, a light pipe, and electrodes. The light pipe is made of resin, has a rectangular parallelepiped shape, and is provided so as to surround an outer circumferential portion of the semiconductor light-receiver. On a center portion of an upper surface of the light pipe, a recessed portion shaped in a frustum of quadrangular pyramid tapered toward the semiconductor light-receiver is formed. The reflective film is shaped in a frustum surface of pyramid tapered toward the semiconductor light-receiver, and is formed on side surfaces of the recessed portion.

3 Claims, 5 Drawing Sheets

PHOTO COUPLER

CROSS REFERENCE TO RELATED APPLICATIONS AND INCORPORATION BY REFERENCE

This application is based upon and claims the benefit of prior Japanese Patent Application P2006-080123 filed on Mar. 23, 2006; the entire contents of which are incorporated by reference herein.

BACKGROUND OF THE INVENTION

1. Field of the Invention

The present invention relates to a photo coupler in which a semiconductor laser and a semiconductor light-receiver are accommodated in a resin protector.

2. Description of the Related Art

A photo coupler including a semiconductor light-emitting device and a semiconductor light-receiver has been known. In such a photo coupler, when an electric input signal is inputted to the semiconductor light-emitting device, the semiconductor light-emitting device emits light corresponding to the input signal. Then, the semiconductor light-receiver receives and converts the light into an electric signal, and outputs the electric signal, whereby the signal is transmitted through the semiconductor light-emitting device and the semiconductor light-receiver.

In a general photo coupler, the semiconductor light-emitting device and the semiconductor light-receiver are embedded at a fixed interval in a resin protector, thereby electrically insulating the semiconductor light-emitting device and the semiconductor light-receiver from each other.

The signal is transmitted in a state where the semiconductor light-emitting device and the semiconductor light-receiver are electrically insulated from each other as described above, and accordingly, propagation of noise included in something except the signal can be prevented, and a withstand voltage of the photo coupler can be enhanced.

Heretofore, in the photo coupler as described above, a light-emitting diode has been applied as the semiconductor light-emitting device. However, since a large amount of carriers must be injected into the light-emitting diode in order to allow the light-emitting diode to emit the light, there has been a problem that it takes a long time to allow the light-emitting diode to emit the light. Therefore, it is difficult to apply the photo coupler including the light-emitting diode to high-speed communication in the order of Gbps (Giga bit per second), which has been required in recent years.

In this connection, a photo coupler in which a semiconductor laser having a current confinement structure and capable of emitting the light by being injected with a little amount of carriers is applied as the semiconductor light-emitting device has been used for the high-speed communication. However, a light irradiation range of the semiconductor laser is small, and accordingly, when the semiconductor light-receiver is disposed to be shifted from a predetermined position, there have been problems that the semiconductor light-emitting device cannot receive the light from the semiconductor laser, and that the semiconductor light-receiver cannot identify the signal even if the semiconductor light-receiver can receive the light therefrom.

In particular, in the case of a surface-emitting laser, a far field pattern (FFP) varies depending on a value of a current supplied thereto, but there is a light irradiation angle where intensity of the light is hardly changed even if such current value is changed. Accordingly, depending on the position where the semiconductor light-receiver is disposed, the semiconductor light-receiver sometimes receives the light with the same intensity even if the signal inputted to the surface-emitting laser varies. Therefore, there has been a problem that the semiconductor light-receiver outputs almost the same signals even if different signals are inputted to the surface-emitting laser.

A description will be specifically made of such problem in the surface-emitting laser with reference to FIG. 1. FIG. 1 is a graph showing relationships between the light intensities and the light irradiation angles for currents of 10 mA and 20 mA, which are supplied to the surface-emitting laser. Note that, in FIG. 1, an axis of ordinates represents the light intensity (mW), and an axis of abscissas represents the light irradiation angle (°). Here, the irradiation angle means an angle between 0° and a line that connects a predetermined position and a center of a light irradiation surface of the surface-emitting laser to each other when a position extended from the center of the light irradiation surface in a stacked direction of laser elements is defined as 0°. Moreover, a bold line in FIG. 1 indicates the light intensity when the current of 10 mA is supplied, and a thin line indicates the light intensity when the current of 20 mA is supplied. The semiconductor light-receiver is set capable of receiving light within an angle of approximately 1°.

In the case of a photo coupler in which the semiconductor light-receiver is disposed at a position along the irradiation direction (irradiation angle: 0°) of the surface-emitting laser, light in a range 100 corresponding to an area with irradiation angles from −0.5° to 0.5° is received by the semiconductor light-receiver. In the photo coupler with such configuration, a difference (refer to a shaded area 100a of FIG. 1) between a light quantity obtained by integrating the curve of 10 mA and a light quantity obtained by integrating the curve of 20 mA is large. Accordingly, two types of signals can be transmitted between the surface-emitting laser and the semiconductor light-receiver.

However, in the case of a photo coupler in which the semiconductor light-receiver is disposed at a position shifted by 8° from the irradiation direction of the surface-emitting laser, light in a range 101 corresponding to an area with irradiation angles from 7.5° to 8.5° is received by the semiconductor light-receiver. In the photo coupler with such configuration, there is hardly a difference (refer to an area 101a of FIG. 1) between the light quantity obtained by integrating the curve of 10 mA and the light quantity obtained by integrating the curve of 20 mA.

From this fact, the signals outputted in response to the received light quantities of two types of signals become almost the same, and accordingly, there has been a problem that the two different types of signals cannot be transmitted between the surface-emitting laser and the semiconductor light-receiver. In particular, the above-described problem has significantly appeared in a photo coupler including a small semiconductor light-receiver in which a diameter of a light receiving portion is approximately 100 µm, such as a pin-type photodiode.

In this connection, there is disclosed a technology for increasing the quantity of the light receivable by the semiconductor light-emitting device. In Patent Document 1 (Japanese Patent Publication No. 2001-358361), there is disclosed a photo coupler, in which the semiconductor light-emitting device and the semiconductor light-receiver are embedded in light-transmittable resin, and the light-transmittable resin is surrounded by light-shielding resin. In this photo coupler, the light is reflected on an interface of the light-transmittable resin has to the light-shielding resin, thus making it possible to prevent leakage of the light emitted by the semiconductor light-emitting device. Accordingly, the quantity of the light received by the semiconductor light-receiver can be increased to some extent. Therefore, transmission accuracy of the signals has been able to be enhanced.

However, in the above-described photo coupler according to Patent Document 1, only the leakage of the light emitted by the semiconductor light-emitting device and only noise light from the outside are prevented. Accordingly, the quantity of the light received by the semiconductor light-receiver is not increased very much. Therefore, there has been a problem that the accuracy at which two types of the signals are transmitted is insufficient.

SUMMARY OF THE INVENTION

The present invention has been created in order to solve the above-described problems. It is an object of the present invention to provide a photo coupler capable of enhancing the accuracy of the transmission of the signals.

To achieve the above objects, a first aspect of the present invention provides an photo coupler, comprising a semiconductor laser; a semiconductor light-receiver to receive light from the semiconductor laser; a light collector configured with a light-reflecting portion having a reflective region shaped in a frustum surface of pyramid or cone tapered toward the semiconductor light-receiver to reflect light from the semiconductor laser toward the semiconductor light-receiver; and a resin protector configured to accommodate and protect the semiconductor laser, the semiconductor light-receiver, and the light collector in an embedded manner.

A second aspect of the present invention is a variation on the first aspect, wherein the light-reflecting portion comprises a metallic film defining the reflective region.

A third aspect of the present invention is a variation on the first aspect, wherein the light-reflecting portion comprises a coat of reflective paint defining the reflective region.

A fourth aspect of the present invention is a variation on the first aspect, wherein the light collector composes a resin pyramid or cone frustum portion having a light refractive index larger than a light refractive index of the resin protector; and the reflective portion is an interface of the resin pyramid or cone frustum portion has to the resin protector.

According to the present invention, the light collector includes the light-reflecting portion having a reflective region shaped in the frustum surface of pyramid or cone tapered toward the semiconductor light-receiver. Accordingly, the light from the semiconductor laser can be suppressed from leaking to the outside, and the light can be collected to the semiconductor light-receiver. In such a way, a range where the light is receivable by the semiconductor light-receiver is increased to a large extent. Accordingly, light in a range where the light intensity varies largely depending on the signal in which the current value varies can also be received. As a result, a difference between the quantities of the light received by the semiconductor light-receiver is increased in response to the signals in which the values of the currents inputted to the semiconductor laser are different from each other. Accordingly, the transmission accuracy of the signals can be enhanced.

DETAILED DESCRIPTION OF THE INVENTION

First Embodiment

Figure 2:
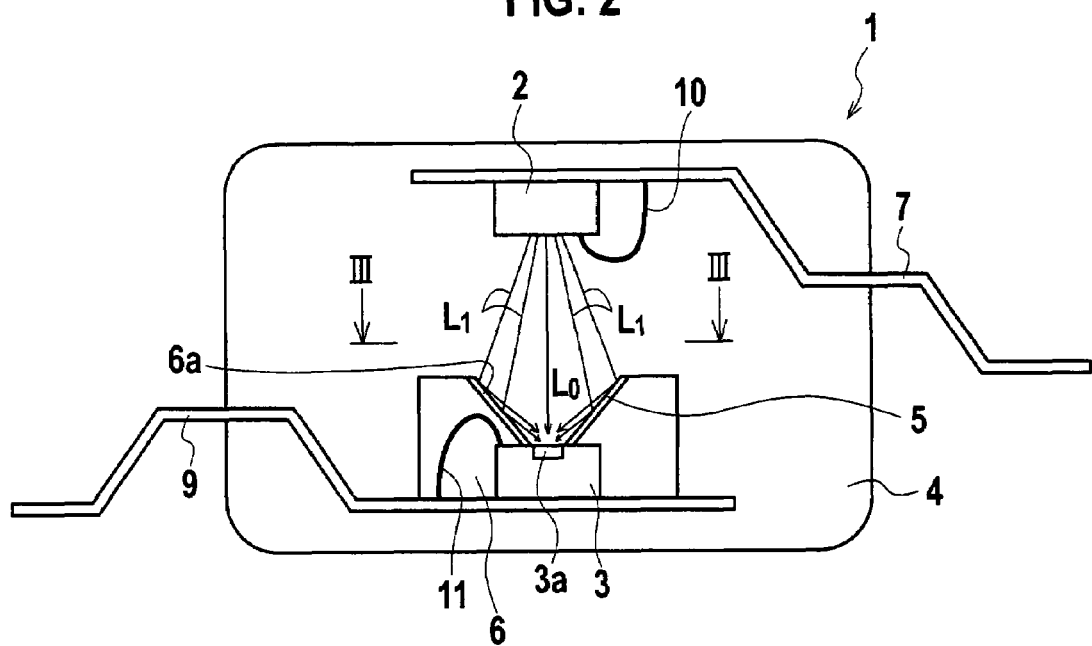
FIG. 2 is a view showing a cross-sectional structure of a photo coupler according to a first embodiment of the present invention.
Figure 3:
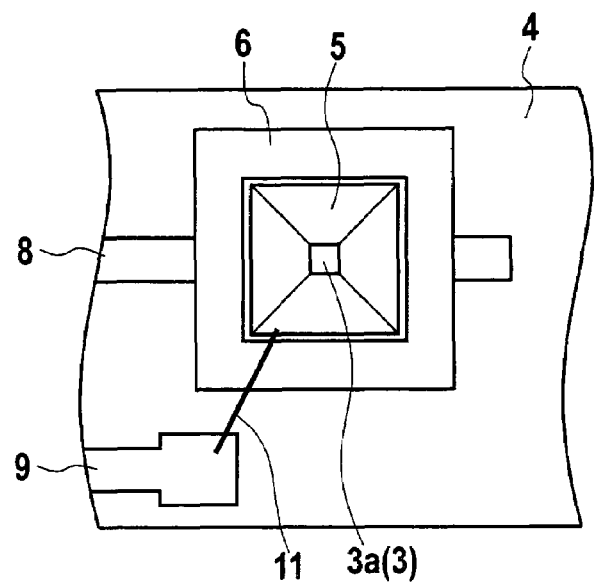
FIG. 3 is a cross-sectional view taken along a line III-III in FIG. 2.

A description will be made of a first embodiment of the present invention with reference to the drawings. FIG. 2 is a view showing a cross-sectional structure of a photo coupler according to the first embodiment of the present invention. FIG. 3 is a cross-sectional view taken along a line III-III in FIG. 2.

As shown in FIG. 2 and FIG. 3, the photo coupler 1 includes a semiconductor laser 2, a semiconductor light-receiver 3, a resin protector 4, a reflective film 5, a light pipe 6, and electrodes 7, 8 and 9. Note that the reflective film 5 and the light pipe 6 correspond to a light collector of claims.

The semiconductor laser 2 is formed of a surface-emitting laser. A lower surface of the semiconductor laser 2 is connected to the electrode 7 on one side, and an upper surface of the semiconductor laser 2 is connected to an electrode (not shown) on the other side through a wire 10.

As the semiconductor light-receiver 3, it is possible to apply a photodiode such as a pin photodiode, a pn photodiode, and an avalanche photodiode. On an upper surface of the semiconductor light-receiver 3, a light-receiving portion 3a is formed, which is capable of receiving light emitted by the semiconductor laser 2 and converting the received light into an electric signal. A lower surface of the semiconductor light-receiver 3 is connected to the electrode 8, and the upper surface of the semiconductor light-receiver 3 is connected to the electrode 9 through a wire 11.

The resin protector 4 to accommodate and protect the semiconductor laser 2, the semiconductor light-receiver 3, the light pipe 6 and the reflective film 5 in an embedded manner is made of insulating resin, and insulates the semiconductor laser 2 and the semiconductor light-receiver 3 from each other. The resin composing the resin protector 4 is composed so as to be capable of transmitting therethrough the light emitted from the semiconductor laser 2.

The light pipe 6 is made of resin, and is accommodated the resin protector 4 in an embedded manner. As the resin composing the light pipe 6, it is possible to apply epoxy system resin, acrylic system resin, and the like. The light pipe 6 has a rectangular parallelepiped shape, and is provided so as to surround an outer circumferential portion of the semiconductor light-receiver 3. On a center portion of an upper surface of the light pipe 6, a recessed portion 6a shaped in a frustum of quadrangular pyramid tapered toward the semiconductor light-receiver 3 is formed.

The reflective film 5 has a reflecting region to reflect the light from the semiconductor laser 2 toward the semiconductor light-receiver 3, and to collect the light to the semiconductor light-receiver 3. The reflecting region of the reflective film 5 is shaped in a frustum surface of pyramid tapered toward the semiconductor light-receiver 3, and is formed on side surfaces of the recessed portion 6a. The reflective film 5 is composed of a material, such as a metallic film and a coat of reflective paint, capable of reflecting light. As the metallic film composing the reflective film 5, it is possible to apply thin films of silver, aluminum, and the like. Moreover, as the reflective paint composing the reflective film 5, it is possible to apply acrylic urethane paint, acrylic paint, acrylic silicon paint, epoxy system paint, polyester system paint, and the like.

In the photo coupler 1 according to the above-described first embodiment of the present invention, when an electric signal is inputted to the semiconductor laser 2, light having intensity corresponding to a current value of the signal is irradiated from the semiconductor laser 2. Then, when the semiconductor light-receiver 3 receives the light, the electric signal having a current value corresponding to the quantity of the received light is outputted.

Here, the photo coupler 1 according to the first embodiment includes the light pipe 6 on which the reflective film 5 is formed. Accordingly, not only light $L_0$ that directly reaches the semiconductor light-receiver 3 from the semiconductor laser 2 but also light $L_1$ that reaches a position shifted from the semiconductor light-receiver 3 therefrom is collected by being reflected on the reflective film 5, and can be received by the semiconductor light-receiver 3.

In such a way, even in the case where the semiconductor light-receiver 3 is disposed at a position where the light intensity does not vary very much even if the current value varies, the light within the range where the light intensity varies largely depending on the current value can also be received by the semiconductor light-receiver 3 since the light-receivable range is widened. Hence, the semiconductor light-receiver 3 can output the signal corresponding to the signal inputted to the semiconductor laser 2, and accordingly, transmission accuracy of the signals can be enhanced.

Moreover, the reflective film 5 formed of the metallic film, a coat of reflective paint, or the like is provided, whereby the light from the semiconductor laser 2 can be surely reflected thereon. Accordingly, the quantity of the light received by the semiconductor light-receiver 3 can be increased.

Figure 4:
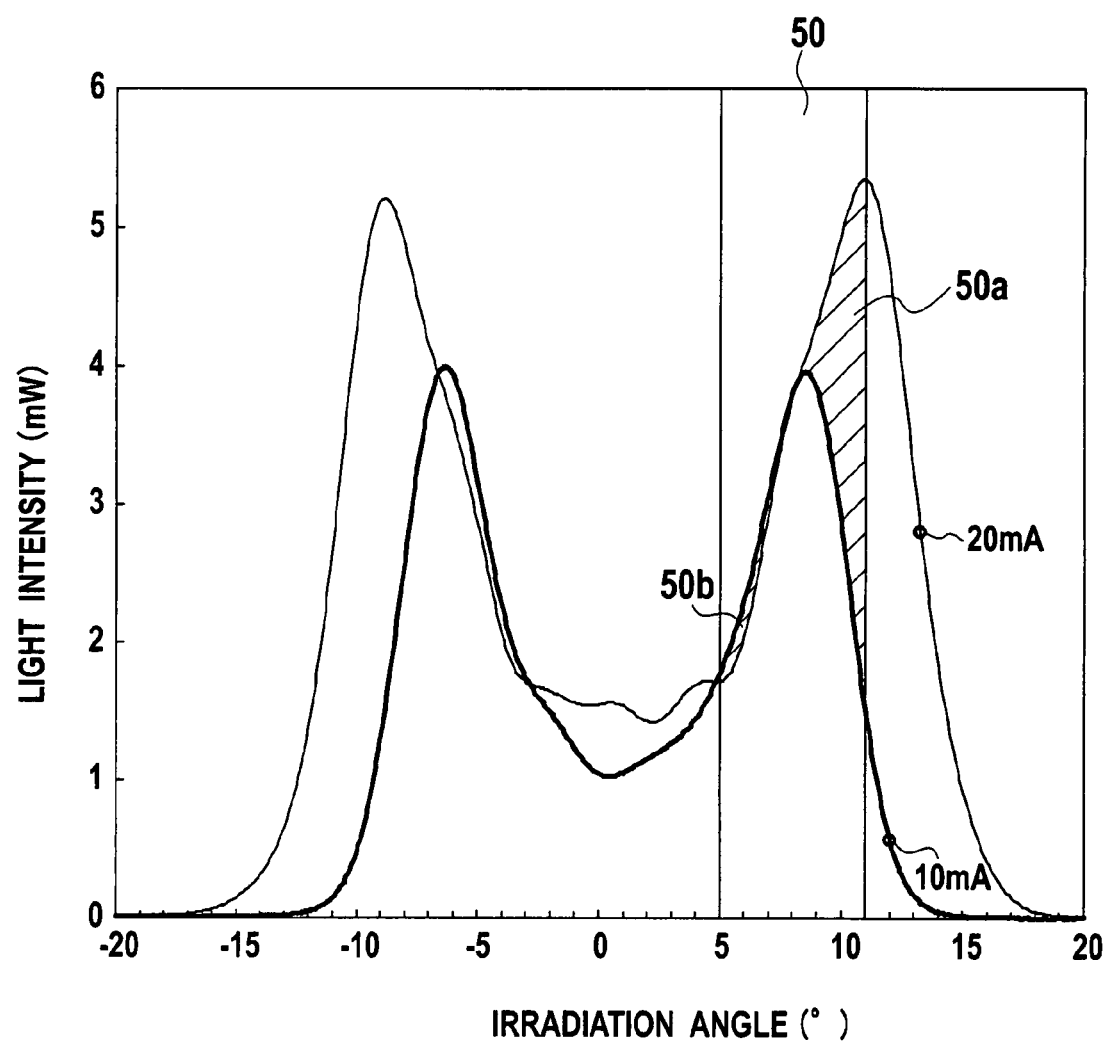
FIG. 4 is a view for explaining an effect of the photo coupler according to the first embodiment.

A description will be specifically made of an effect of the above-described accuracy of the signal transmission with reference to FIG. 4. Note that FIG. 4 is a view showing outputs of a surface-emitting laser capable of outputting the same light as the light from the surface-emitting laser described with reference to FIG. 1.

As shown in FIG. 4, it is assumed that the semiconductor light-receiver 3 is disposed at a position shifted by approximately 8° from the irradiation direction (0°) of the semiconductor laser 2, and that it becomes possible for the semiconductor light-receiver 3 to receive light within an angle of approximately 6° by the reflective film 5. Hence, the semiconductor light-receiver 3 can receive light within an angle range of approximately 5° to approximately 11°.

Figure 1:
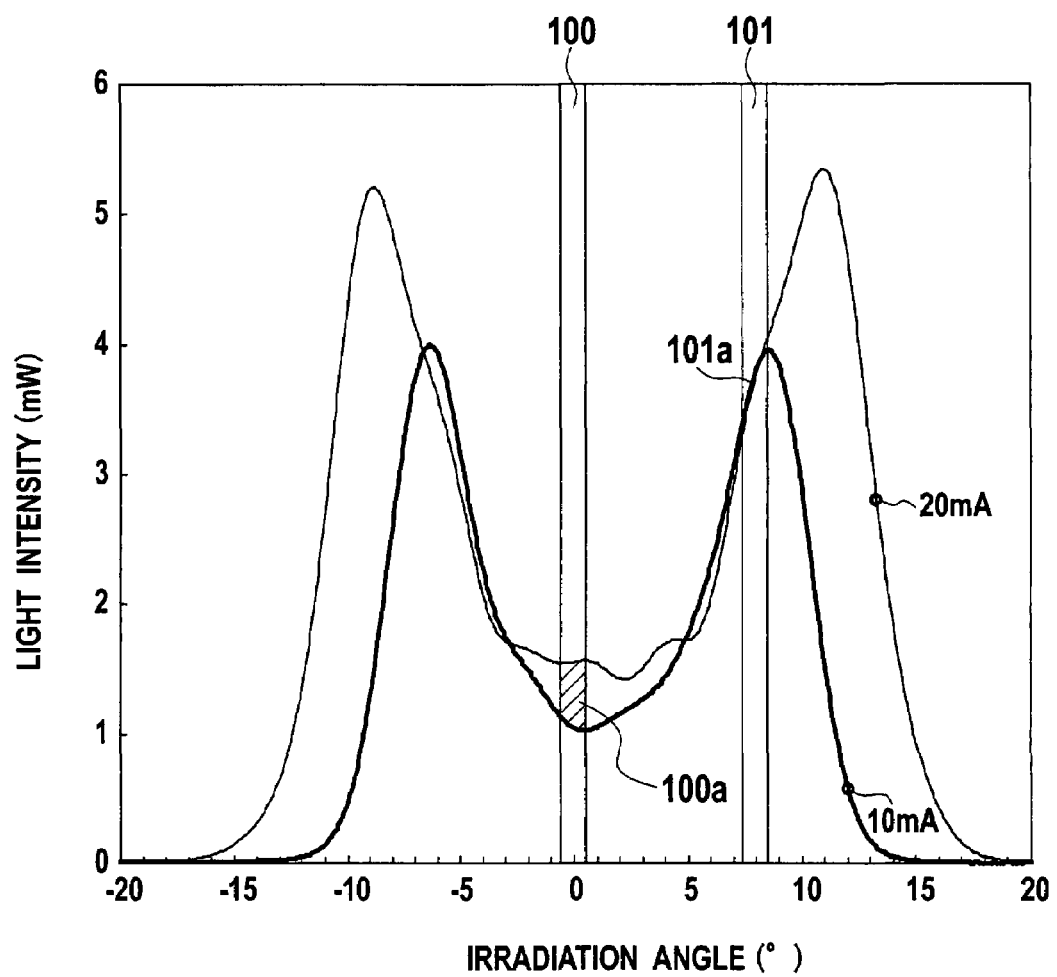
FIG. 1 is a view for explaining problems of a conventional photo coupler.

As described above, when the conventional photo coupler is disposed at the same position, only the light in the direction of 7.5° to 8.5° can be received, and accordingly, the quantity of the light received by the semiconductor light-receiver is hardly changed between two current values (refer to the range 101a of FIG. 1). However, in the photo coupler 1, the light irradiated within the angle range of approximately 5° to approximately 11°, which is shown in an area 50 of FIG. 4, can be received. Accordingly, the light with the irradiation angles where the light intensity corresponding to the electric signal of 10 mA and the light intensity corresponding to the electric signal of 20 mA largely differ from each other can also be received. In such a way, a difference ("area 50a-area 50b" of FIG. 4) between the quantities of the light, which correspond to the signals of the current values 10 mA and 20 mA, becomes large. Accordingly, the semiconductor light-receiver 3 can output largely different signals, and can enhance the transmission accuracy of two signals.

Second Embodiment

Figure 5:
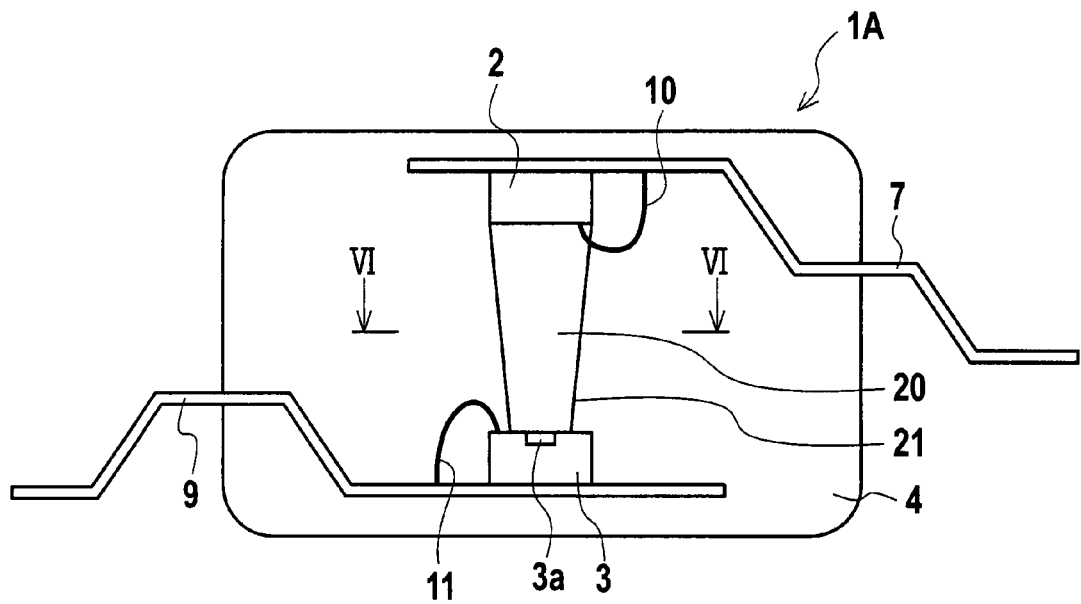
FIG. 5 is a view showing a cross-sectional structure of a photo coupler according to a second embodiment of the present invention.
Figure 6:
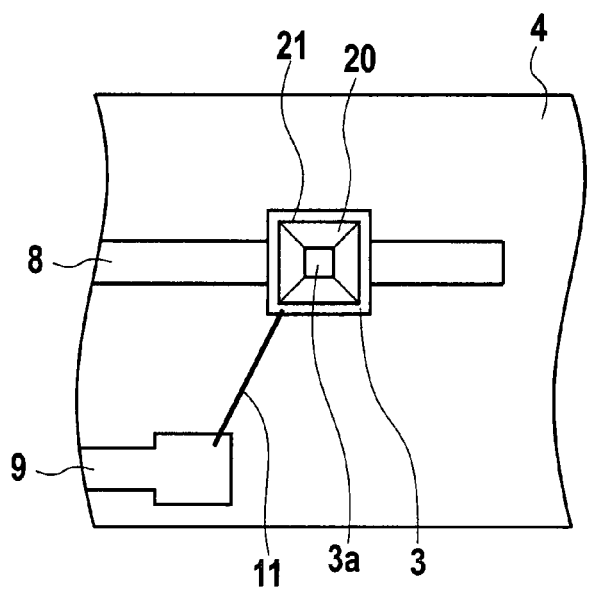
FIG. 6 is a cross-sectional view taken along a line VI-VI in FIG. 5.

Next, a description will be made of a second embodiment in which an optical waveguide having a light-reflecting portion using a difference in light refractive index is provided. FIG. 5 is a view showing a cross-sectional structure of a photo coupler according to the second embodiment of the present invention. FIG. 6 is a cross-sectional view taken along a line VI-VI in FIG. 5. Note that the same reference numerals are assigned to similar components to those of the first embodiment, and a description thereof will be omitted.

As shown in FIG. 5 and FIG. 6, the photo coupler 1A includes the semiconductor laser 2, the semiconductor light-receiver 3, the resin protector 4, an optical waveguide (corresponding to a resin pyramid frustum portion of claims) 20, and a light-reflecting portion 21. Note that the optical waveguide 20 and the light-reflecting portion 21 correspond to the light collector of claims.

As shown in FIG. 5 and FIG. 6, the optical waveguide 20 is shaped in a frustum of quadrangular pyramid tapered toward the semiconductor light-receiver 3, and is formed from the semiconductor laser 2 to the semiconductor light-receiver 3. The optical waveguide 20 is made of resin having a light refractive index larger than a light refractive index of the resin composing the resin protector 4.

Hence, an interface of the optical waveguide 20 has to the resin protector 4 functions as the light-reflecting portion 21 capable of reflecting the light from the semiconductor laser 2. Hence, the light-reflecting portion 21 becomes like a frustum surface of pyramid tapered toward the semiconductor light-receiver 3, and can collect the light, which is emitted by the semiconductor laser 2, to the semiconductor light-receiver 3.

As described above, the photo coupler 1A according to the second embodiment can also exert a similar effect to that of the photo coupler 1 according to the first embodiment since the photo coupler 1A includes the light-reflecting portion 21 capable of collecting the light, which is emitted by the semiconductor laser 2, to the semiconductor light-receiver 3.

Moreover, the optical waveguide 20 is composed only of the resin, thus making it possible to simplify the manufacturing process of the photo coupler 1A.

Third Embodiment

Figure 7:
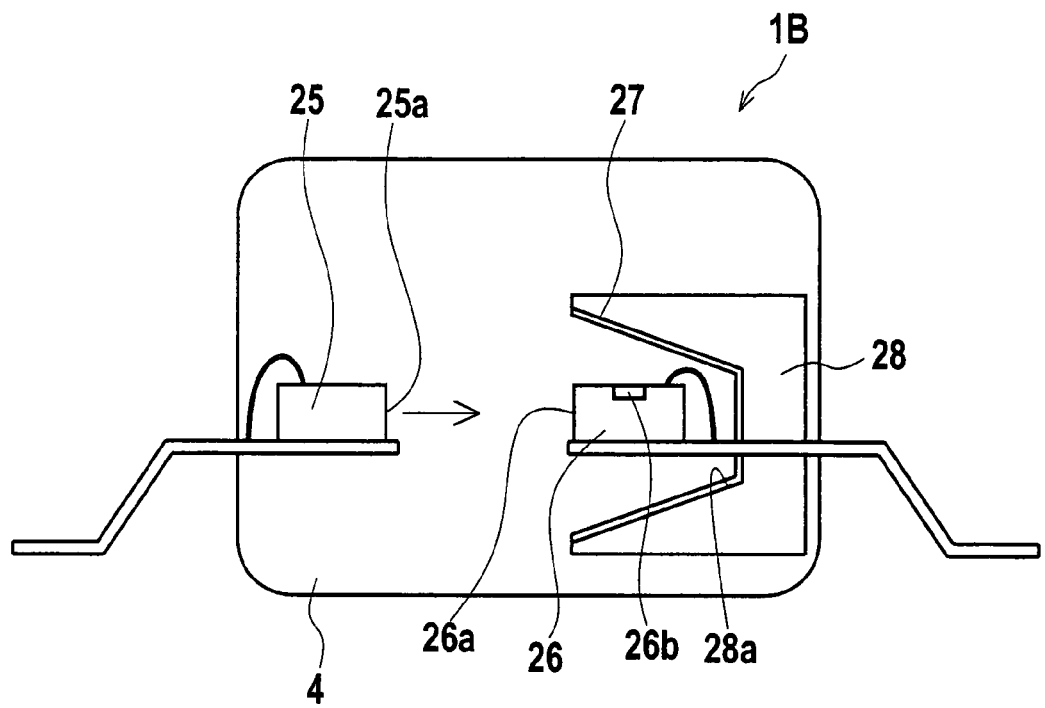
FIG. 7 is a view showing a cross-sectional structure of a photo coupler according to a third embodiment of the present invention.

Next, a description will be made of a third embodiment in which a semiconductor laser of an edge emitting type is provided. FIG. 7 is a view showing a cross-sectional structure of a photo coupler according to the third embodiment of the present invention. Note that the same reference numerals are assigned to similar components to those of the above-described respective embodiments, and a description thereof will be omitted.

As shown in FIG. 7, the photo coupler 1B according to the third embodiment includes a semiconductor laser 25, a semiconductor light-receiver 26, a reflective film 27, a light pipe 28, and the resin protector 4.

As shown in FIG. 7, the semiconductor laser 25 is of an edge emitting type in which an active layer is composed of InGaAsP or the like, and the light is emitted from an edge surface 25a.

The semiconductor light-receiver 26 is a photodiode, and is composed so as to be capable of receiving the light by a light-receiving portion 26b formed on a part of a substrate 26a capable of transmitting therethrough the light emitted by the semiconductor laser 25. For example, when a wavelength of the light emitted by the semiconductor laser 25 is 1200 nm to 1600 nm, as an example of the semiconductor light-receiver 26, the one can be applied, in which the light-receiving portion 26b made of InGaAs is provided on the substrate 26a that is made of InP and capable of transmitting the light therethrough. Moreover, as the semiconductor light-receiver 26, it is possible to apply a photodiode of an edge incident type.

The light pipe 28 is made of resin, in which a recessed portion 28a shaped in a frustum of quadrangular pyramid formed so as to be tapered toward the semiconductor light-receiver 26 is formed. On an inner surface of the recessed portion 28a, the reflective film 27 is formed.

As described above, the photo coupler 1B according to the third embodiment can also exert a similar effect to that of the photo coupler 1 according to the first embodiment since the photo coupler 1B includes the reflective film 27 capable of collecting the light, which is emitted by the semiconductor laser 25, to the semiconductor light-receiver 26.

Fourth Embodiment

Figure 8:
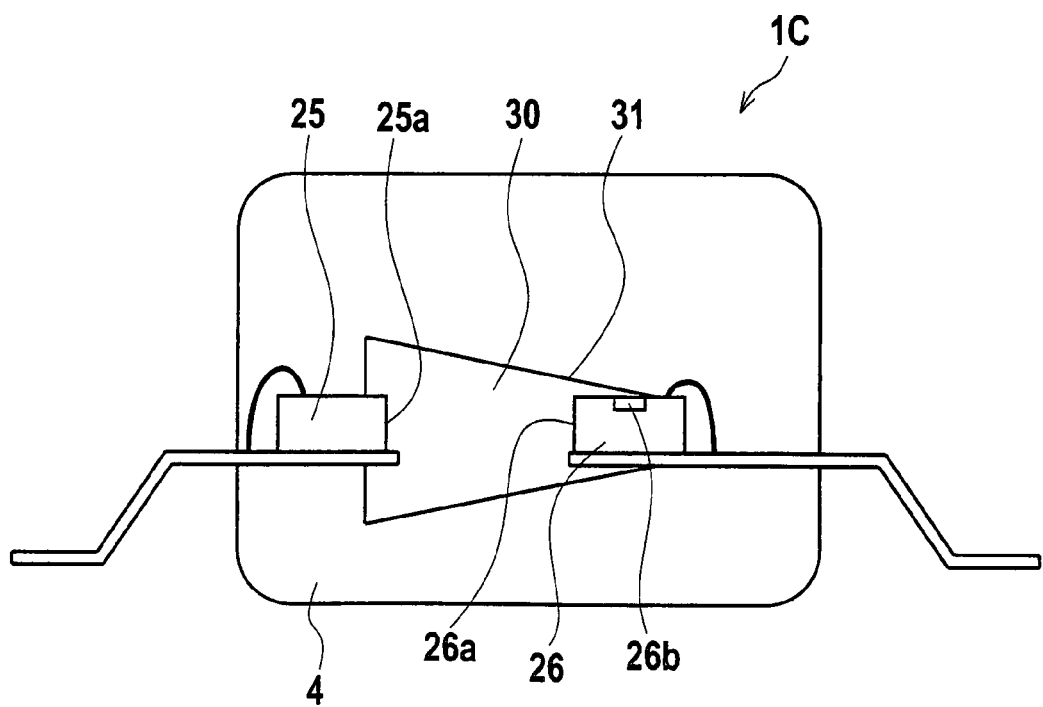
FIG. 8 is a view showing a cross-sectional structure of a photo coupler according to a fourth embodiment of the present invention.

Next, a description will be made of a fourth embodiment in which a semiconductor laser of the edge emitting type is provided. FIG. 8 is a view showing a cross-sectional structure of a photo coupler according to the fourth embodiment of the present invention. Note that the same reference numerals are assigned to similar components to those of the above-described respective embodiments, and a description thereof will be omitted.

The photo coupler 1C according to the fourth embodiment includes the semiconductor laser 25, the semiconductor light-receiver 26, an optical waveguide 30, a light-reflecting portion 31, and the resin protector 4.

As shown in FIG. 8, in the photo coupler 1C, the optical waveguide 30 shaped in a frustum of pyramid tapered toward the semiconductor light-receiver 26 is provided between the semiconductor laser 25 and the semiconductor light-receiver 26. The optical waveguide 30 is made of resin having a light refractive index larger than the light refractive index of the resin composing the resin protector 4. Hence, an interface of the optical waveguide 30 has to the resin protector 4 functions as the light-reflecting portion 31 capable of reflecting and collecting the light from the semiconductor laser 25.

As described above, the photo coupler 1C according to the fourth embodiment can also exert a similar effect to that of the photo coupler 1 according to the first embodiment since the photo coupler 1C includes the optical waveguide 30 in which the light-reflecting portion 31 capable of introducing the light, which is emitted by the semiconductor laser 25, into the semiconductor light-receiver 26 is formed.

The description has been made above in detail of the present invention by using the foregoing embodiments; however, it is obvious that the present invention is not limited to the embodiments described in this specification. The present invention can be modified and carried out within the gist and scope of the present invention defined by the description of the scope of claims. Specifically, the description of this specification is a mere example of the present invention, and does not allow the present invention to be interpreted in any restrictive meaning at all. A description will be made below of a modified embodiment in which the above-described embodiment is partially modified.

The photo couplers 1 and 1B of the foregoing first and third embodiments are composed so as to separately provide the reflective films 5 and 27 on the light pipes 6 and 28; however, the photo couplers 1 and 1B may be composed so that the interfaces of the light pipes have to the resin protectors and can be the light-reflecting portions in such a manner that the light pipes are composed of resin having a light refractive index larger than a light refractive index of the resin composing the resin protectors.

In the photo couplers 1A and 1C of the foregoing second and fourth embodiments, the interfaces of the optical waveguides 20 and 30 have to the resin protectors 4 are applied as the light-reflecting portions 21 and 31; however, a reflective film made of metal, reflective paint, or the like may be formed on each interface of the optical waveguide has to the resin protectors. In the case of adopting such configuration, the optical waveguide and the resin protectors may be composed of the same resin.

In the foregoing respective embodiments, the reflective film and the light-reflecting portion are shaped in the frustum surface of quadrangular pyramid; however, each of the reflective film and the light-reflecting portion just needs to have such a frustum surface of pyramid or cone as tapered toward the semiconductor light-emitting device, and can be shaped in a frustum surface of cone and a frustum surface of polygonal pyramid.

As described above, it is a matter of course that the present invention incorporates various embodiments and the like, which are not described herein. Hence, the technical scope of the present invention is defined only by the following claims reasonable from the foregoing description.

What is claimed is:

1. A photo coupler comprising:
    a semiconductor laser;
    a semiconductor light-receiver to receive light from the semiconductor laser;
    a light collector configured with a light-reflecting portion having a reflective region shaped in a frustum surface of pyramid or cone tapered toward the semiconductor light-receiver to reflect light from the semiconductor laser toward the semiconductor light-receiver; and
    a resin protector configured to accommodate and protect the semiconductor laser, the semiconductor light-receiver, and the light collector in an embedded manner, wherein
    the light collector comprises at least one of a resin pyramid and a cone frustum portion having a light refractive index larger than a light refractive index of the resin protector; and
    the light-reflecting portion is an interface of the resin protector and the at least one of the resin pyramid and the cone frustum portion.

2. The photo coupler of claim 1, wherein:
    the light-reflecting portion comprises a metallic film defining the reflective region.

3. The photo coupler of claim 1, wherein:
    the light-reflecting portion comprises a coat of reflective paint defining the reflective region.

* * * * *